US008450787B2

(12) United States Patent
Akahori et al.

(10) Patent No.: US 8,450,787 B2
(45) Date of Patent: May 28, 2013

(54) NONVOLATILE SEMICONDUCTOR MEMORY AND METHOD OF MANUFACTURING THE SAME

(75) Inventors: Hiroshi Akahori, Yokohama (JP); Wakako Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/277,255

(22) Filed: Oct. 20, 2011

(65) Prior Publication Data

US 2012/0032253 A1 Feb. 9, 2012

Related U.S. Application Data

(62) Division of application No. 12/923,646, filed on Sep. 30, 2010, now Pat. No. 8,071,444, which is a division of application No. 12/037,693, filed on Feb. 26, 2008, now Pat. No. 7,829,950.

(30) Foreign Application Priority Data

Feb. 27, 2007 (JP) .................................. 2007-46934

(51) Int. Cl.
  *H01L 29/76* (2006.01)
  *H01L 29/792* (2006.01)
  *H01L 23/58* (2006.01)

(52) U.S. Cl.
  USPC ..... 257/314; 257/324; 257/635; 257/E23.309

(58) Field of Classification Search
  USPC ............................ 257/635, 314, 324, E29.309
  See application file for complete search history.

(56) References Cited

U.S. PATENT DOCUMENTS

| 6,200,858 B1 | 3/2001 | Kokubu |
| 6,472,281 B2 | 10/2002 | Doi et al. |
| 7,060,559 B2 | 6/2006 | Ozawa et al. |
| 2005/0179069 A1 | 8/2005 | Wakamiya |
| 2006/0240619 A1 | 10/2006 | Ozawa et al. |

FOREIGN PATENT DOCUMENTS

| JP | 01-134936 | 5/1989 |
| JP | 7-249697 | 9/1995 |
| JP | 10-163348 | 6/1998 |
| KR | 2006-80150 | 7/2006 |

OTHER PUBLICATIONS

Takeuchi et al; "Semiconductor Memory Device and Method for Manufacturing the Same"; U.S. Appl. No. 11/870,839, filed Oct. 11, 2007.
Aoki et al.; "Semiconductor Device and Method of Fabricating the Same"; U.S. Appl. No. 11/902,752, filed Sep. 25, 2007.
Akahori et al.; "Nonvolatile Semiconductor Memory Device"; U.S. Appl. No. 11/870,793, filed Oct. 11, 2007.
Notification of Reasons for Rejection issued by the Korean Patent Office on Nov. 23, 2009, for Korean Patent Application No. 10-2008-0017327, and English-language translation thereof.
Notification of Reasons for Rejection issued by the Japanese Patent Office on May 27, 2011, for Japanese Patent Application No. 2007-046934, and English-language translation thereof.

*Primary Examiner* — David S Blum
(74) *Attorney, Agent, or Firm* — Finnegan, Henderson, Farabow, Garrett & Dunner, L.L.P.

(57) ABSTRACT

A nonvolatile semiconductor memory has a semiconductor substrate, a first insulating film formed on a channel region on a surface portion of the semiconductor substrate, a charge accumulating layer formed on the first insulating film, a second insulating film formed on the charge accumulating layer, a control gate electrode formed on the second insulating film, and a third insulating film including an Si—N bond that is formed on a bottom surface and side surfaces of the charge accumulating layer.

12 Claims, 18 Drawing Sheets

NONVOLATILE SEMICONDUCTOR MEMORY AND METHOD OF MANUFACTURING THE SAME

CROSS REFERENCE TO RELATED APPLICATIONS

This is a division of U.S. patent application No. 12/923,646, filed Sep. 30, 2010 (now U.S. Pat. No. 8,071,444 A1, issued Dec. 6, 2011 2010, which is a division of U.S. patent application No. 12/037,693, filed Feb. 26, 2008 (now U.S. Pat. No. 7,829,950 B2, issued Nov. 9, 2010), which is incorporated herein by reference.

This application is based upon and claims benefit of priority from the Japanese Patent Application No. 2007-46934, filed on Feb. 27, 2007, the entire contents of which are incorporated herein by reference.

BACKGROUND OF THE INVENTION

1. Field of the Invention

The present invention relates to a nonvolatile semiconductor memory and a method of manufacturing the nonvolatile semiconductor memory.

2. Related Art

There is a nonvolatile memory of a double gate structure in which there are provided a floating gate electrode and a control gate electrode positioned above the floating gate electrode, a magnetic field is applied by this control gate electrode and a charge is injected into the floating gate electrode or a charge is extracted from the floating gate electrode by Fowler-Nordheim tunneling, thereby permitting electrical writing or erase of data.

In this structure, a polycrystalline silicon layer that becomes the floating gate electrode is sandwiched between a tunnel insulating film and an interpoly insulating film, and a charge is injected into the floating gate electrode by F-N tunneling of electrons from a silicon substrate. As a result of this, the inversion threshold voltage of a channel region is adjusted in association with the charging of the floating gate electrode and the on-off condition of a transistor is determined.

In such a nonvolatile memory, the reliability of an insulating film is important. In this reliability, the effect of a bird's beak becomes great in association with the miniaturization of elements. In the post-oxidation step after the formation of a tunnel insulating film and a floating gate electrode, an oxidizer enters the interior from a gate end portion of a tunnel insulating film and oxidizes the surface of a silicon substrate where a channel is formed and the surface of a floating gate electrode formed by polycrystalline silicon, whereby this bird's beak is formed.

When a bird's beak has been formed, the film thickness of that place becomes large and a tunnel current does not flow easily any more. As a result of this, a tunnel current concentrates in a flat area of a thin film where no bird's beak has been formed, the film quality of that place deteriorates, and insulating film reliability decreases.

When the channel length and channel width of a transistor are large, the concentration of a tunnel current has a small effect because the flat area of a thin film covers a wide region of the insulating film even when a bird's beak has been formed. However, the effect of a bird's beak increases as miniaturization becomes to a greater extent.

Furthermore, it is difficult to control the amount of a bird's beak. A bird's beak causes variations in the capacitance of a tunnel insulating film, and these variations contribute to the deterioration in the performance of a device.

Because the surface side of a floating gate electrode that is formed by polycrystalline silicon having a high impurity concentration is oxidized thicker than the silicon substrate surface where a channel is formed, it is necessary to suppress the oxidization of the floating gate electrode in order to suppress the formation of a bird's beak.

There has been proposed a method of suppressing the formation of a bird's beak in an interpoly insulating film, though not a tunnel insulating film (refer to Japanese Patent Laid-Open No. 7-249697, for example). This method involves controlling the formation of a bird's beak by using an NONON-film formed by inserting a silicon nitride film each above and below an ONO-film (a stacked film composed of an oxide film-nitride film-oxide film) as an interpoly insulating film.

However, because the side surfaces of the floating gate electrode and the side surfaces of the control gate electrode are not nitrided, in the post-oxidation step after the processing of the transistor gates, the side surfaces of the floating gate electrode and the control gate electrode are oxidized, resulting in diminished sizes.

Because the polycrystalline silicon that forms the gate electrode has various planar direction dependences, the oxidation amount in post-oxidation varies from cell to cell. That is, variations in gate size occur for each cell.

Therefore, variations in the oxidation amount of the side walls of the polycrystalline silicon that forms the floating gate electrode cannot be suppressed simply by inserting silicon nitride films into the interface of the interpoly insulating Film even if the formation of a bird's beak can be suppressed thereby.

The variations in cell shape lead to variations in the characteristics of a cell transistor. In order to absorb variations in the characteristics of a transistor, it becomes necessary to sacrifice other performance capabilities of a semiconductor device, for example, it becomes necessary to lower the writing speed. All things considered, this leads to the deterioration of the performance of a semiconductor device. That is, a reduction of variations in cell shape is a very important item of technology development.

SUMMARY OF THE INVENTION

According to one aspect of the present invention, there is provided a nonvolatile semiconductor memory, comprising:
  a semiconductor substrate;
  a first insulating film formed on a channel region on a surface portion of the semiconductor substrate;
  a charge accumulating layer formed on the first insulating film;
  a second insulating film formed on the charge accumulating layer;
  a control gate electrode formed on the second insulating film; and
  a third insulating film including an Si—N bond that is formed on a bottom surface and side surfaces of the charge accumulating layer.

According to one aspect of the present invention, there is provided a method of manufacturing a nonvolatile semiconductor memory, comprising:
  forming a first insulating film on a semiconductor substrate;
  forming a first electrode layer, which becomes a charge accumulating layer, on the first insulating film;

etching the first electrode layer, the first insulating film and the semiconductor substrate with prescribed gaps along a first direction, thereby forming a first trench;

oxynitriding an inner wall of the first trench;

forming a buried insulating film where the first trench is buried;

forming a second insulating film on the buried insulating film and the first electrode layer;

forming a second electrode layer, which becomes a control gate electrode, on the second insulating film;

forming a third insulating film on the second electrode layer;

etching the third insulating film, the second electrode layer, the second insulating film and the first electrode layer with prescribed gaps along a second direction orthogonal to the first direction, thereby forming a second trench;

oxidizing an inner wall of the second trench; and implanting an impurity into the semiconductor substrate, with the third insulating film serving as a mask, thereby forming an impurity dispersion region.

DETAILED DESCRIPTION OF THE INVENTION

A nonvolatile semiconductor memory related to an embodiment of the present invention will be described below on the basis of the drawings.

Figure 1:
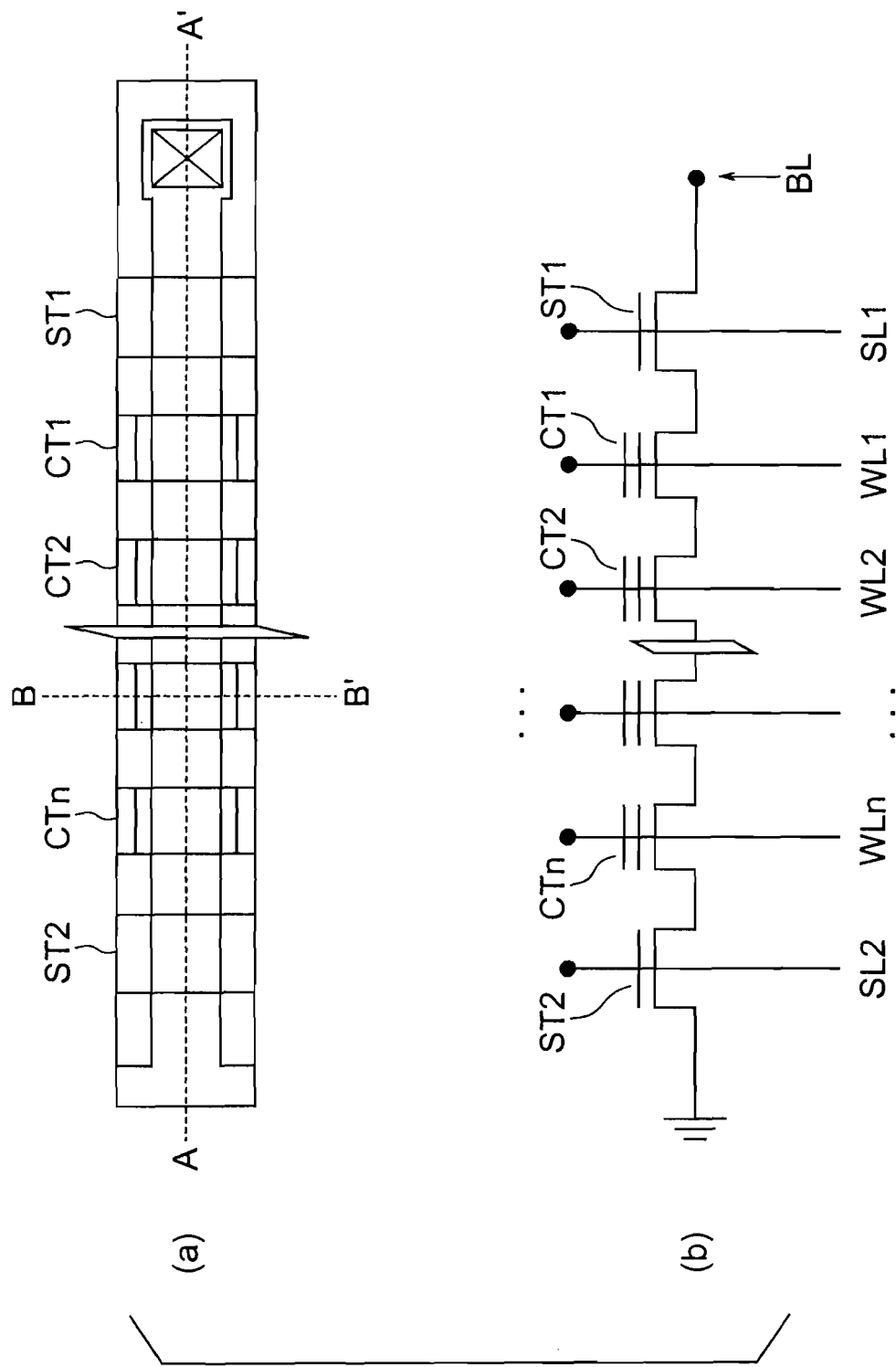
FIG. 1 is a diagram showing the schematic configuration of a nonvolatile semiconductor memory related to an embodiment of the present invention.

The schematic configuration of a nonvolatile semiconductor memory related to an embodiment of the present invention is shown in FIG. 1. The nonvolatile semiconductor memory in this embodiment is a NAND type flash memory. FIG. 1(a) shows a top view of a cell array structure, and FIG. 1(b) shows a schematic diagram of a longitudinal section taken along the line A-A' (a first direction) in FIG. 1(a).

In the nonvolatile semiconductor memory, a plurality of cell transistors CT1 to CTn, each of which has a floating gate electrode and a control gate electrode, are connected in series.

A drain of the cell transistor CT1 is connected to a bit line BL via a selection transistor ST1, and a source of the cell transistor CTn is connected to a source wire via a selection transistor ST2.

The cell transistors CT1 to CTn and the selection transistors ST1, ST2 are formed on the same well substrate, and control gate electrodes of the cell transistors CT1 to CTn are each connected to word lines WL1 to WLn that are continuously arrayed in the row direction (a second direction orthogonal to the first direction).

One end of each of the word lines WL1 to WLn is provided with a connection pad with a peripheral circuit via a metal interconnect. Each of the gate electrodes of the selection transistors ST1, ST2 is connected to selection lines SL1, SL2, respectively.

Although FIG. 1(a) shows the cell transistors CT1 to CTn and the selection transistors ST1, ST2 in one row alone, in this nonvolatile semiconductor memory there are formed cell transistors CT1 to CTn and selection transistors ST1, ST2 that are connected in series in a plurality of rows with prescribed gaps along the second direction.

Figure 2:
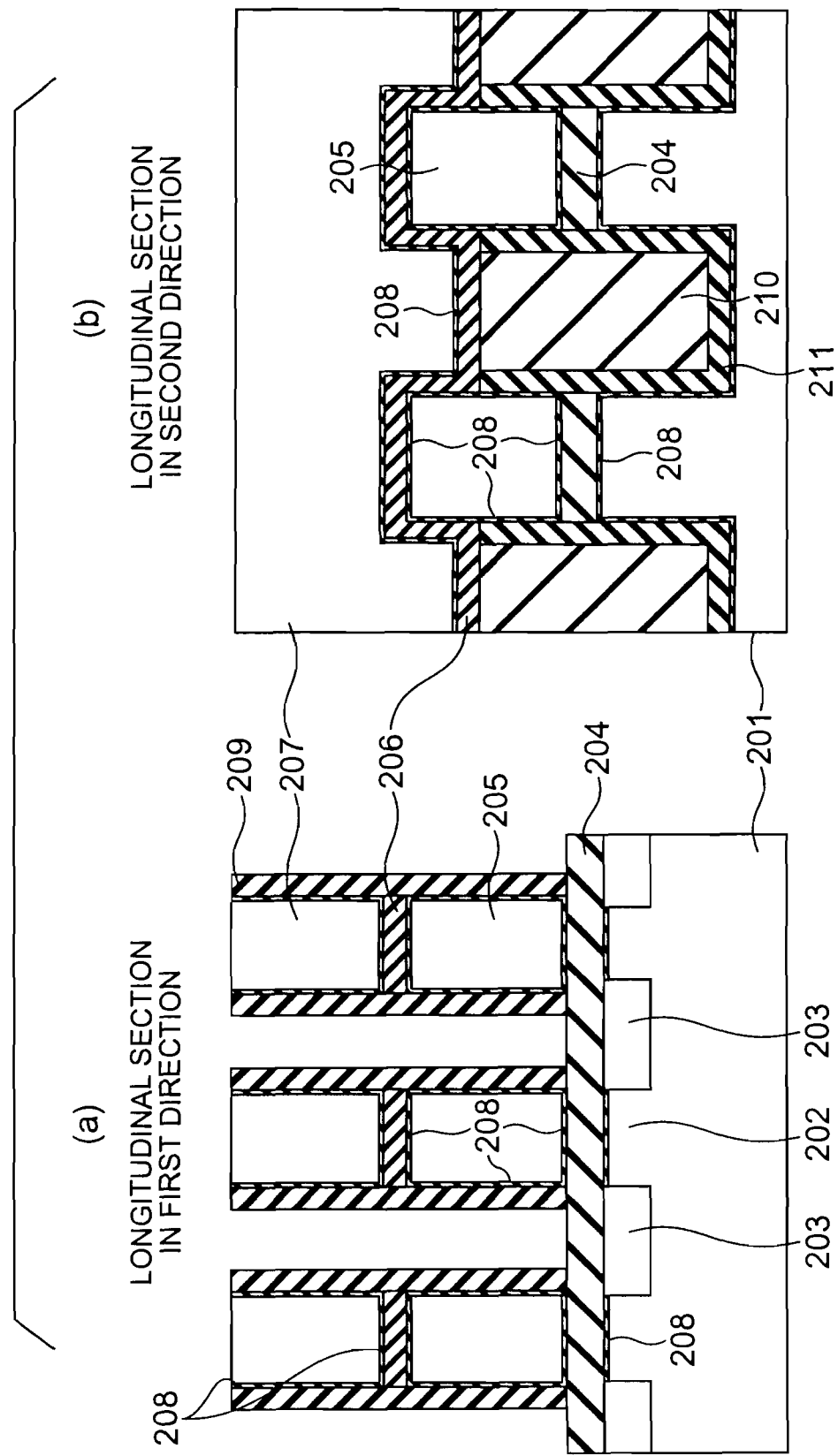
FIG. 2 is a diagram showing the section of a nonvolatile semiconductor memory related to this embodiment.
Figure 3:
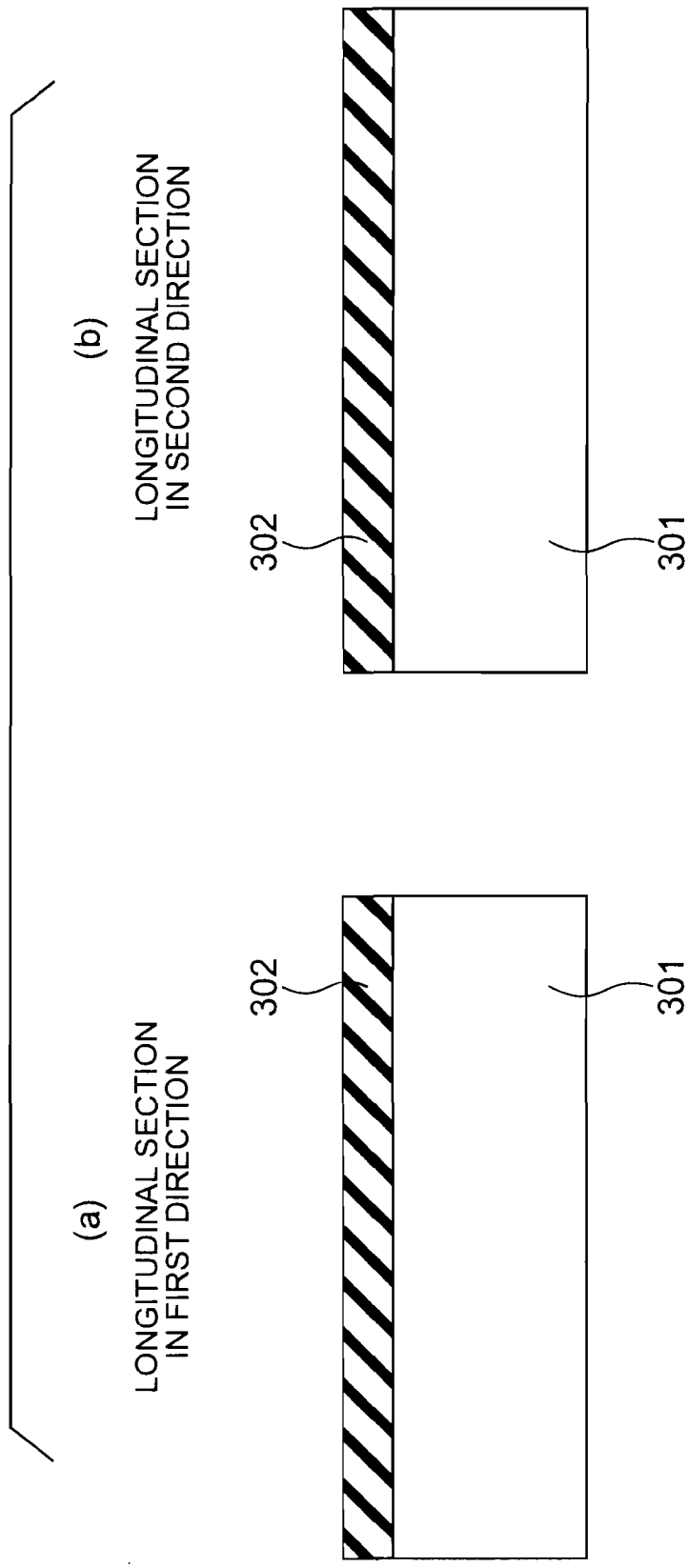
FIG. 3 is a diagram showing in section one step of a method of manufacturing a nonvolatile semiconductor memory related to this embodiment.
Figure 4:
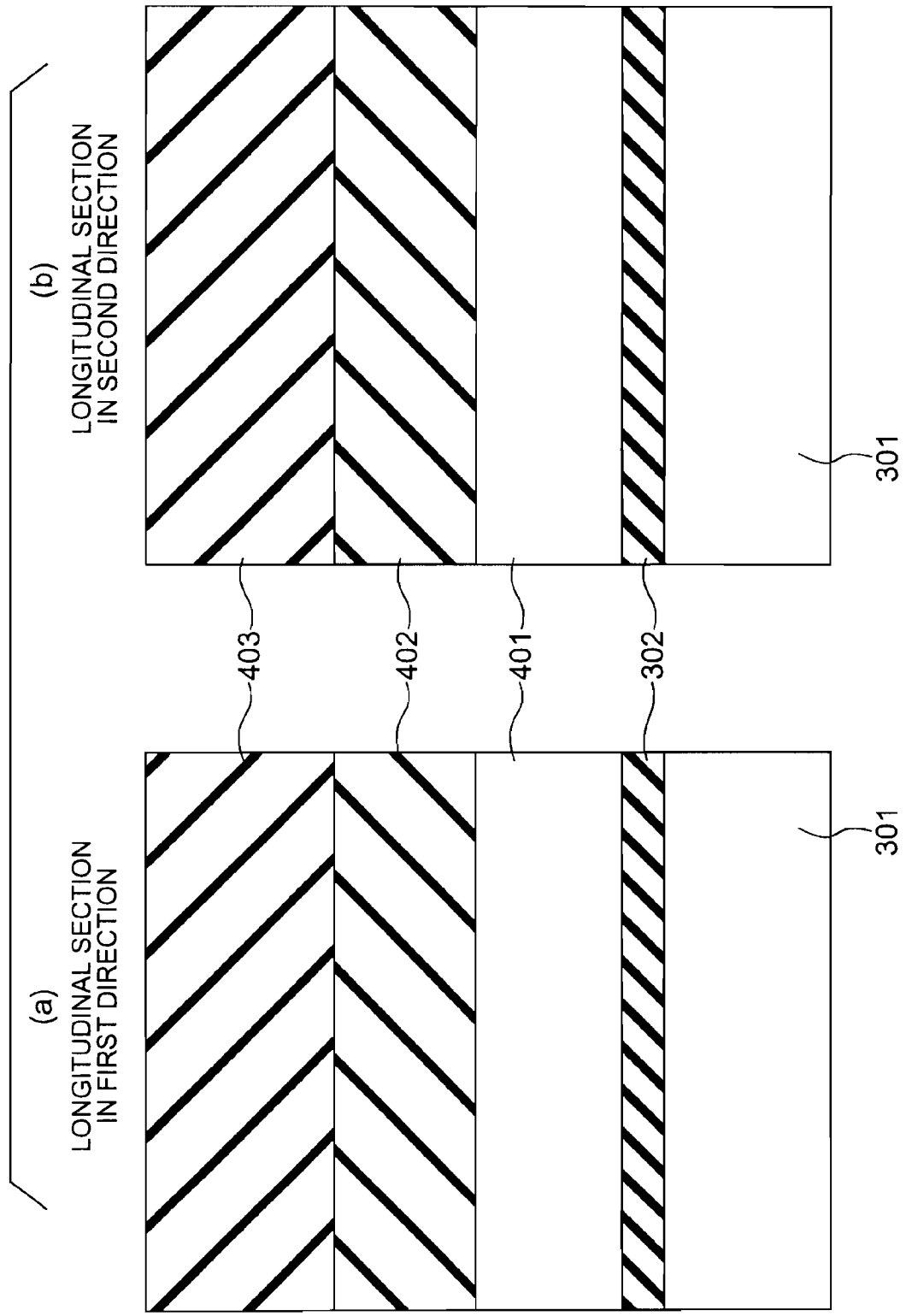
FIG. 4 is a sectional view showing a step subsequent to FIG. 3.
Figure 5:
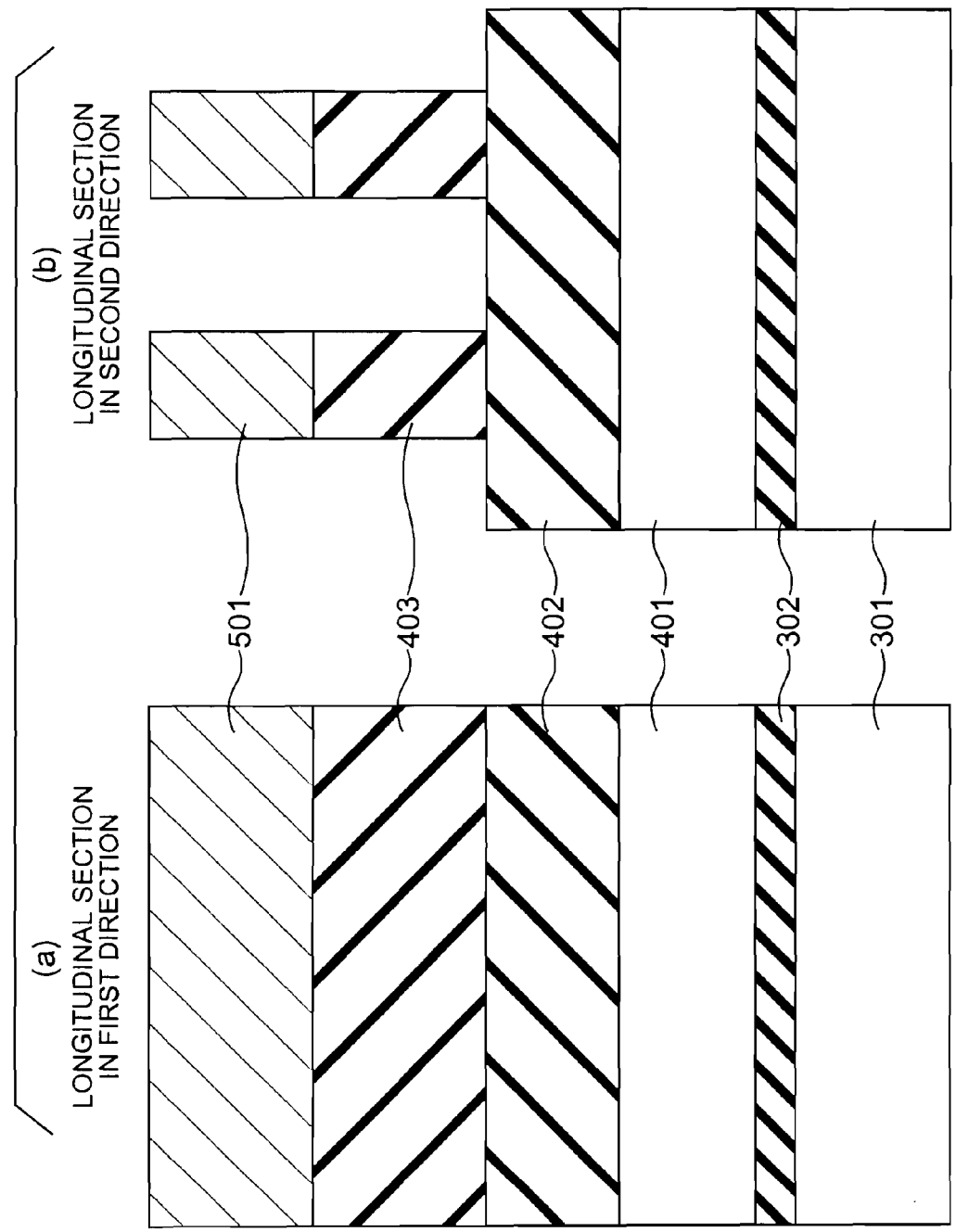
FIG. 5 is a sectional view showing a step subsequent to FIG. 4.
Figure 6:
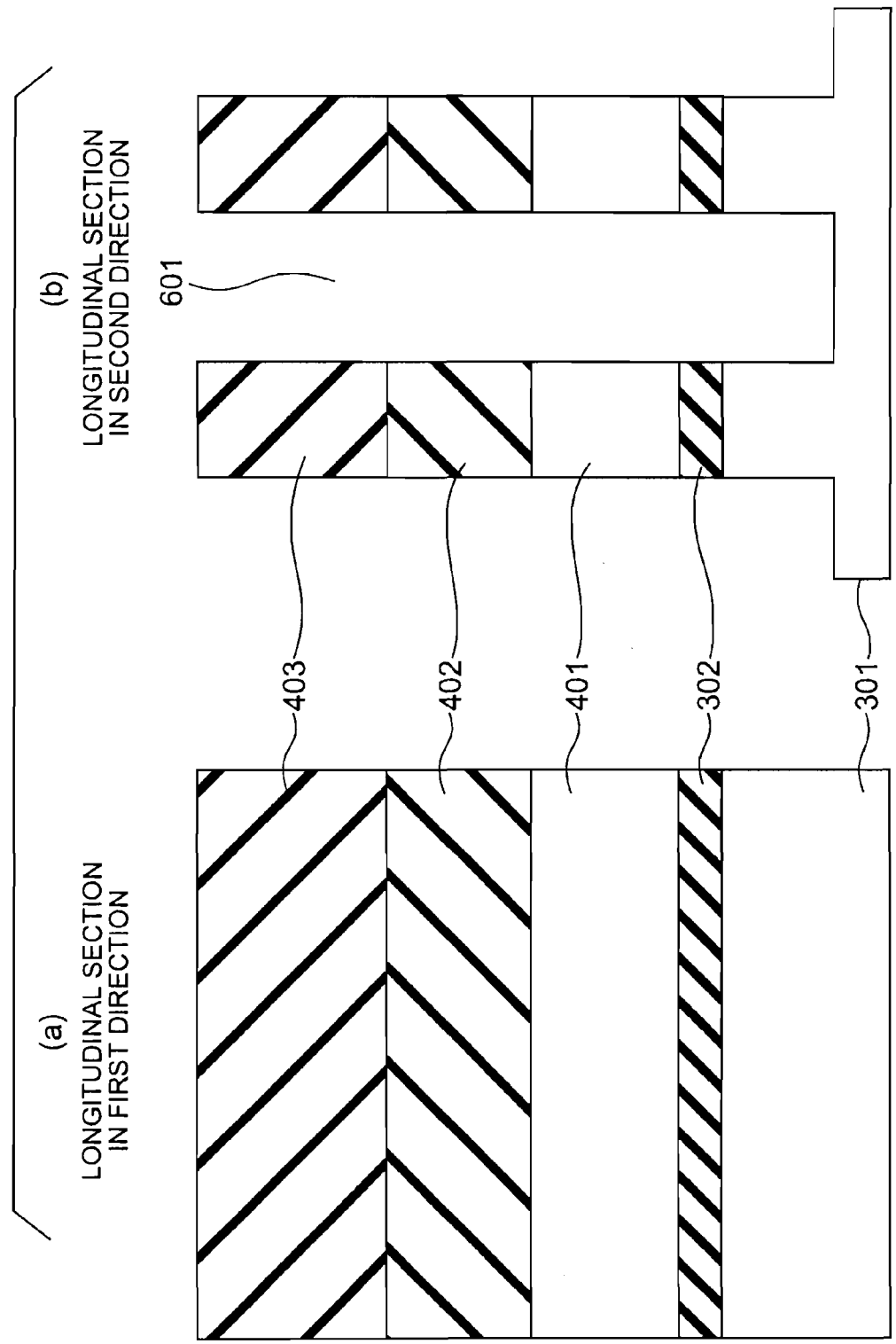
FIG. 6 is a sectional view showing a step subsequent to FIG. 5.

FIG. 2(a) shows a schematic configuration of a longitudinal section taken along the line A-A' (in the first direction) shown in FIG. 1(a), and FIG. 2(b) shows a schematic configuration of a longitudinal section taken along the line B-B' (in the second direction).

In the nonvolatile semiconductor memory, source-drain regions 203 are formed on a surface portion of a silicon substrate 201, with a channel region 202 sandwiched therebetween, and a tunnel oxide film 204 is formed on the silicon substrate 201.

Furthermore, upon the tunnel oxide film 204 are sequentially stacked a floating gate electrode 205 formed from polycrystalline silicon, an interpoly insulating film 206, and a control gate electrode 207 formed from polycrystalline silicon with prescribed gaps along the second direction.

Also, buried type element isolating regions 210 are formed with prescribed gaps along the first direction.

A layer containing an Si—N bond (a nitrogen-precipitated layer) 208 is formed on the top surface, side surfaces and bottom surface of the floating gate electrode 205 and on the bottom surface and side surfaces of the control gate electrode 207.

Also, a silicon oxide film 209 is formed on the side walls of the floating gate electrode 205, the interpoly insulating film 206 and the control gate electrode 207, and a silicon oxide film 211 is formed on the side wall portions and bottom of the element isolating region 210.

A layer containing an Si—N bond (a nitrogen-precipitated layer) 208 is formed under silicon oxide film 211 at the bottom of the element isolating region 210. The tunnel oxide film 204 is a silicon oxynitride film, and the interpoly insulating film 206 is an ONO film.

A layer containing an Si—N bond (a nitrogen-precipitated layer) 208 is formed so as to cover the floating gate electrode 205 and the control gate electrode 207, and it is possible to prevent an oxidizer from reaching the floating gate electrode 205 and the control gate electrode 207, thereby suppressing the formation of a bird's beak. Furthermore, it is possible to suppress the occurrence of the diminishing of the gates and variations in gate size.

As described above, the nonvolatile semiconductor memory in this embodiment obtains improved device performance and high reliability.

Next, a method of manufacturing this nonvolatile semiconductor memory will be described by using the sectional views of the steps shown in FIGS. 3(a) and 3(b) to FIGS. 18(a) and 18(b)(except FIG. 9). For the same step, the sectional views of the steps show vertical sections in two directions, i.e., in the first direction and the second direction orthogonal to the first direction.

As shown in FIGS. 3(a) and 3(b), a silicon oxide film having a thickness of 9 nm is formed on a silicon substrate 301 by using the thermal oxidation method, and a silicon oxynitride film 302 is formed by nitriding this silicon oxide film with an ammonia ($NH_3$) gas.

As shown in FIGS. 4(a) and 4(b), a polycrystalline silicon film 401 having a thickness of 100 nm is formed by the CVD method on the silicon oxynitride film 302. Furthermore, a silicon nitride film 402 and a silicon oxide film 403 are deposited on the polycrystalline silicon film 401.

As shown in FIGS. 5(a) and 5(b), a photoresist 501 is applied to the silicon oxide film 403 and patterned in strip shape by using the lithography method with prescribed gaps along the first direction, and the silicon oxide film 403 is processed by RIE (reactive ion etching), with the photoresist 501 serving as a mask.

As shown in FIGS. 6(a) and 6(b), the photoresist 501 is removed, and the silicon nitride film 402, the polycrystalline silicon film 401, the silicon oxynitride film 302, and the silicon substrate 301 are processed by RIE, with the silicon oxide film 403 serving as a mask, whereby a trench 601 is formed.

As shown in FIGS. 7(a) and 7(b), an inner wall of the trench 601 is oxidized, whereby a silicon oxide film 701 is formed. It is preferable to use radical oxidation in oxidizing the inner wall of the trench 601.

As shown in FIGS. 8(a) and 8(b), oxynitriding treatment is performed with a nitric oxide (NO) gas or a nitrous oxide ($N_2O$) gas. Nitrogen passes through the silicon oxide film 701 and precipitates on the surfaces of the silicon substrate 301 and the polycrystalline silicon 401, whereby a layer having an Si—N bond (a nitrogen-precipitated layer) 801 is formed.

Figure 9:
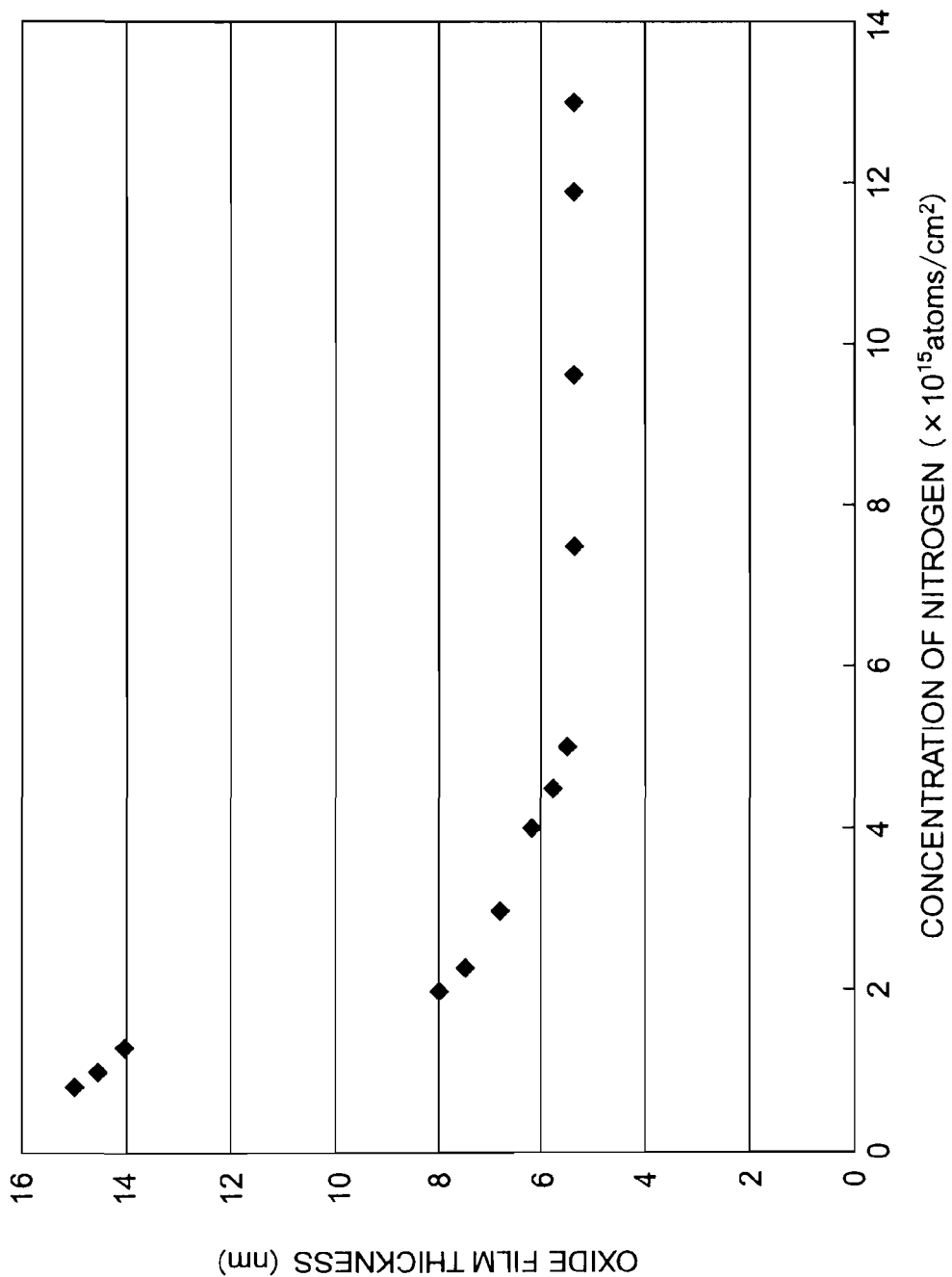
FIG. 9 is a diagram showing the relationship between oxidation resistance and the nitrogen content at the interface.

FIG. 9 shows the relationship between oxidation resistance and interface nitrogen concentration. In the sample, a silicon oxide film having a thickness of 5 nm was formed on a silicon substrate by thermal oxidation treatment and after that, nitriding treatment was performed in a nitric oxide (NO) atmosphere, whereby nitrogen was precipitated on the interface between the silicon and the silicon oxide film.

The concentration of the precipitated nitrogen fluctuates between $0.8 \times 10^{15}$ and $1.3 \times 10^{16}$ atoms/cm$^2$. In this structure, RTO (rapid thermal oxidation) was conducted from above the silicon oxide film at 1085° C. for 60 seconds so that oxygen passed through the film of nitrogen precipitated at the interface, and whether or not the silicon substrate is oxidized was investigated.

In FIG. 9, the ordinate indicates the oxide film thickness on the silicon substrate and the abscissa indicates the concentration of the nitrogen precipitated at the interface between the silicon substrate and the silicon oxide film.

If the oxide film thickness on the silicon substrate can maintain 5 nm, which is the initial oxide film thickness, nitrogen has a blocking capability against oxidizers. In contrast, if a silicon oxide film having a thickness of not less than 5 nm is formed, this means that the silicon substrate penetrates through the nitrogen layer and is oxidized and it can be said that the oxidation resistance is low.

It is apparent from FIG. 9 that the higher the nitrogen concentration, the more the oxidation due to the penetration through the nitrogen layer will tend to be suppressed. The oxidation due to the penetration through the nitrogen layer is greatly suppressed when the nitrogen concentration is not less than $2 \times 10^{15}$ atoms/cm$^2$. When it is ensured that the nitrogen concentration is preferably at $5 \times 10^{15}$ atoms/cm$^2$, the oxide film of the silicon substrate does not change from 5.4 nm, and this means that the oxidation resistance is sufficient.

Therefore, the nitrogen concentration of the layer having an Si—N bond (the nitrogen-precipitated layer) 801 is preferably not less than $2 \times 10^{15}$ atoms/cm$^2$ and more preferably not less than $5 \times 10^{15}$ atoms/cm$^2$.

Figure 10:
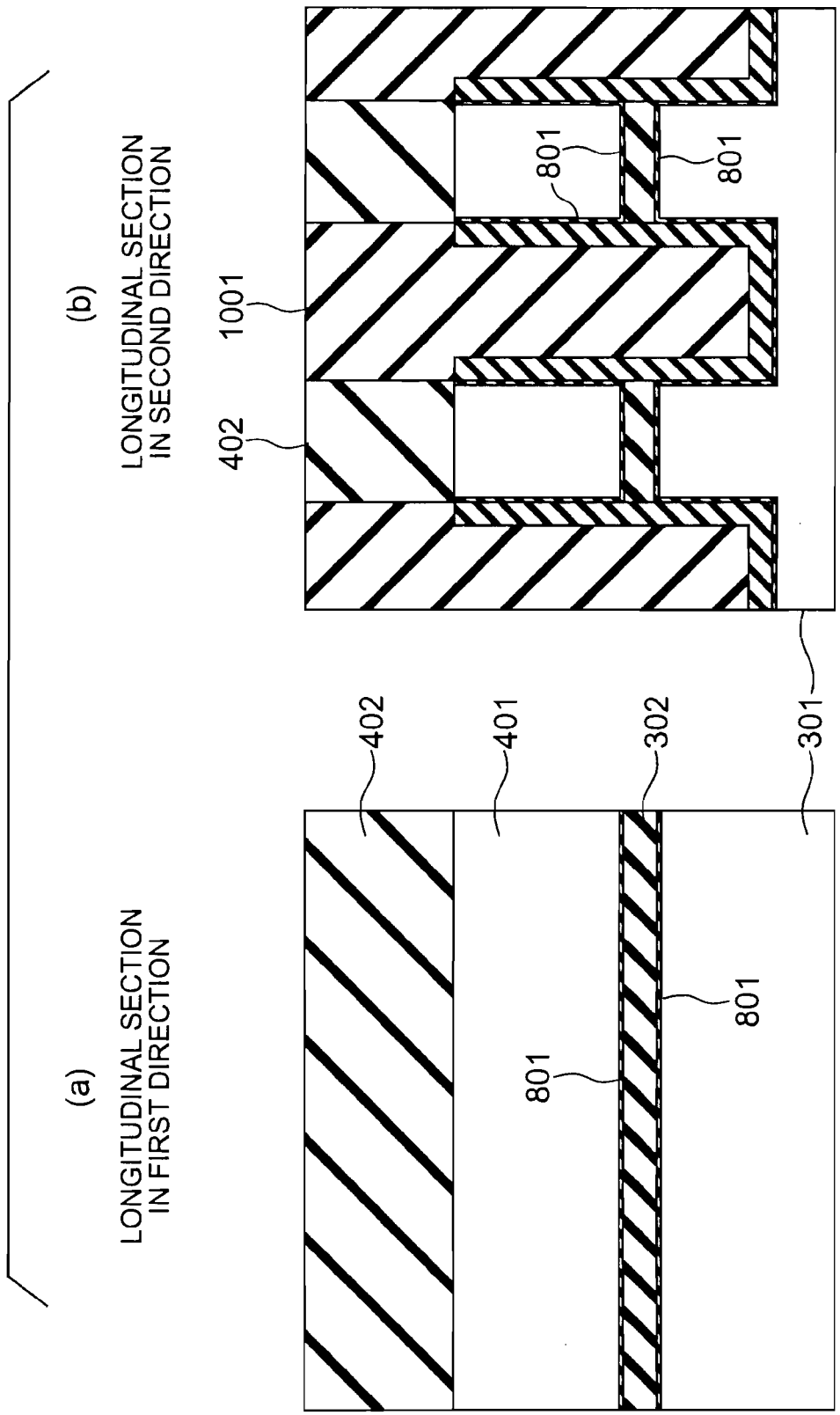
FIG. 10 is a sectional view showing a step subsequent to FIG. 8.
Figure 11:
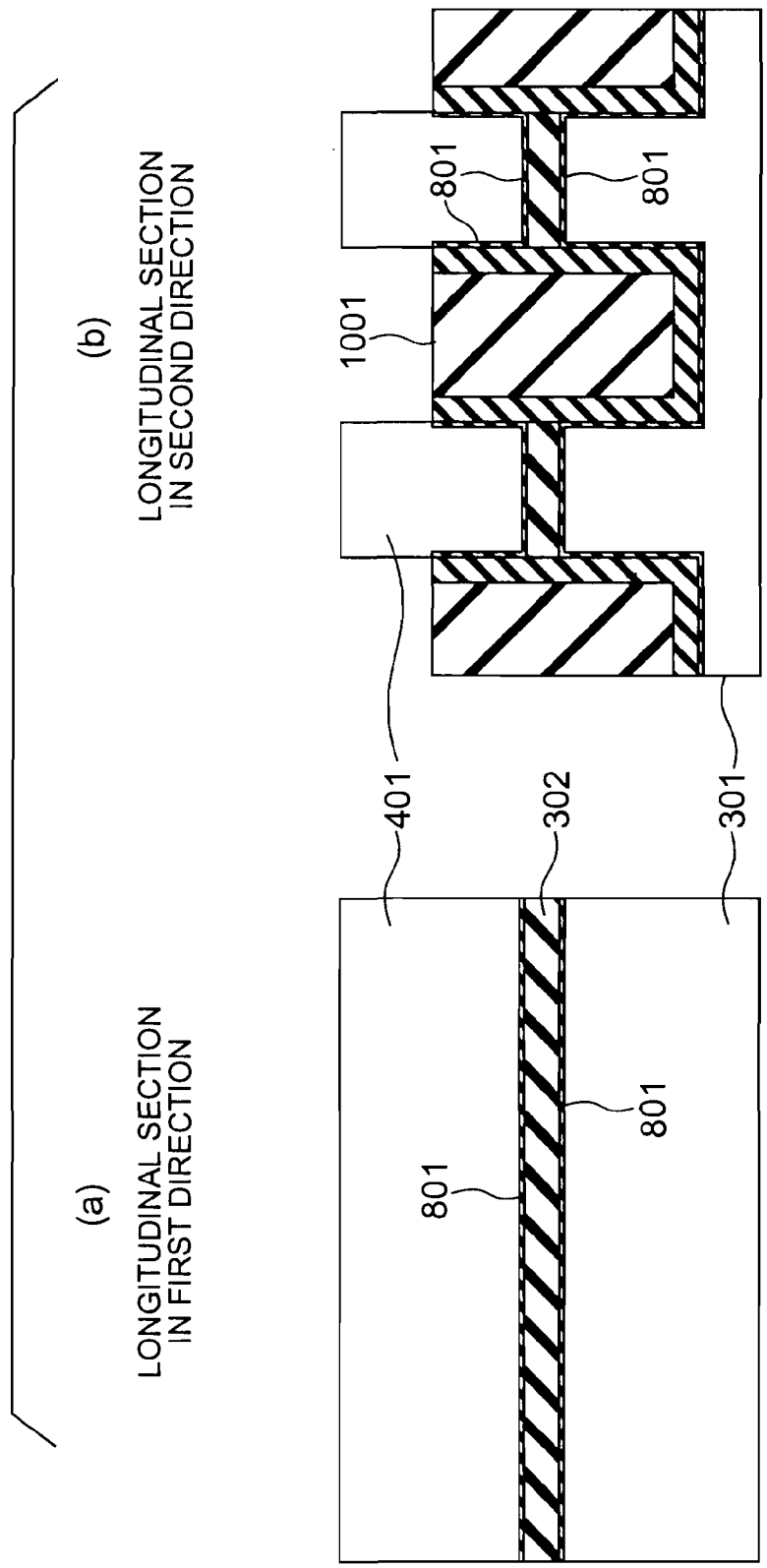
FIG. 11 is a sectional view showing a step subsequent to FIG. 10.
Figure 12:
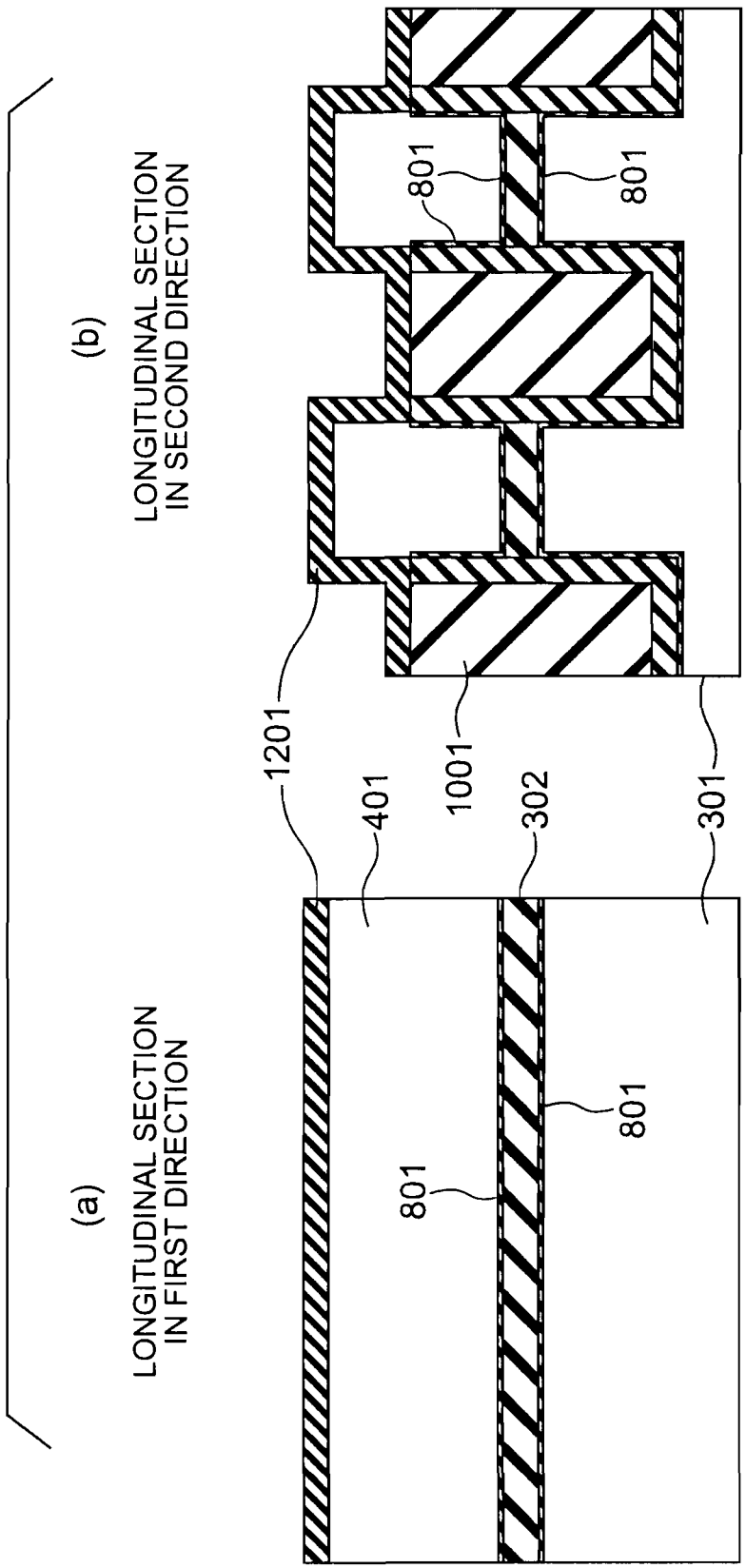
FIG. 12 is a sectional view showing a step subsequent to FIG. 11.
Figure 13:
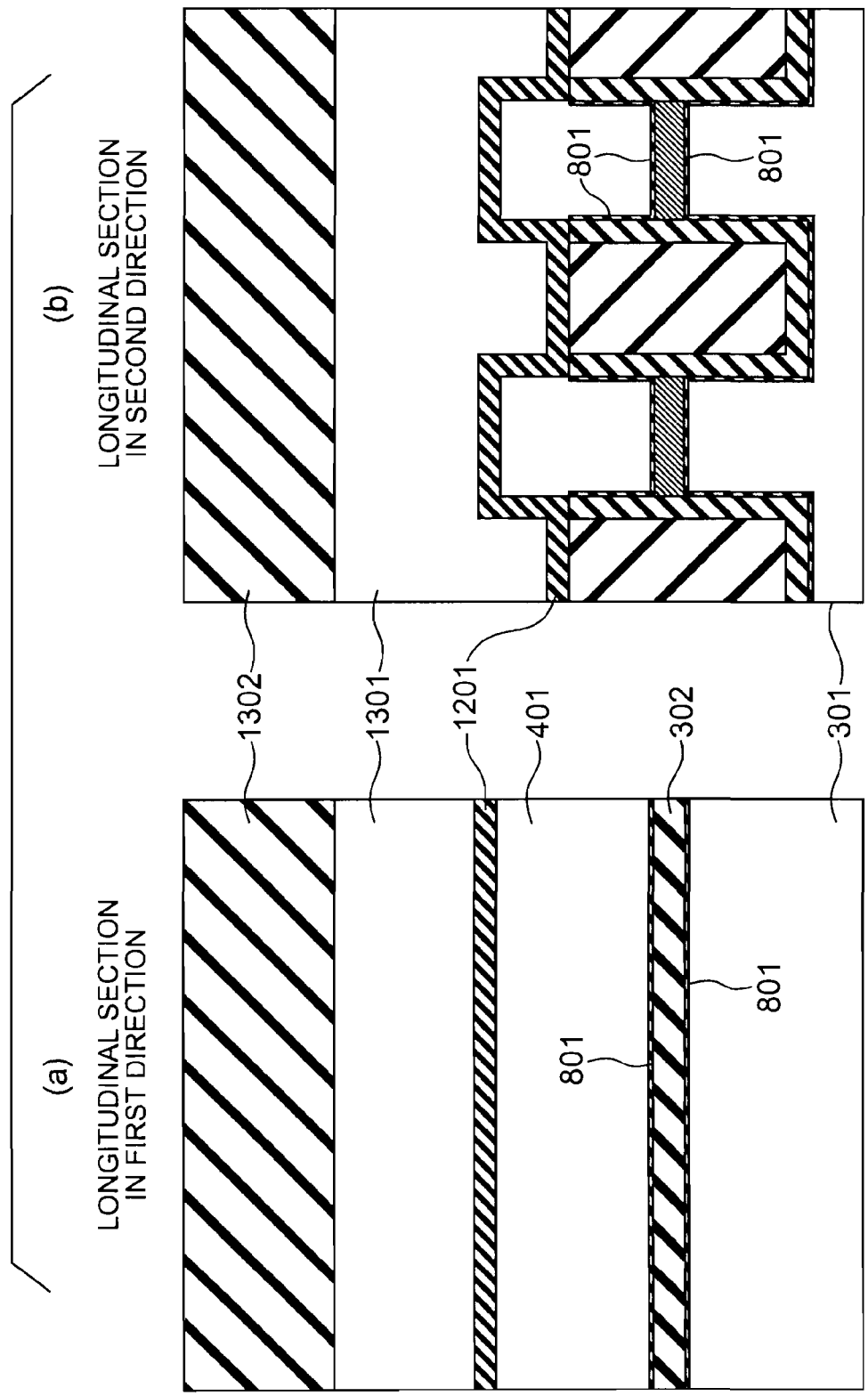
FIG. 13 is a sectional view showing a step subsequent to FIG. 12.
Figure 14:
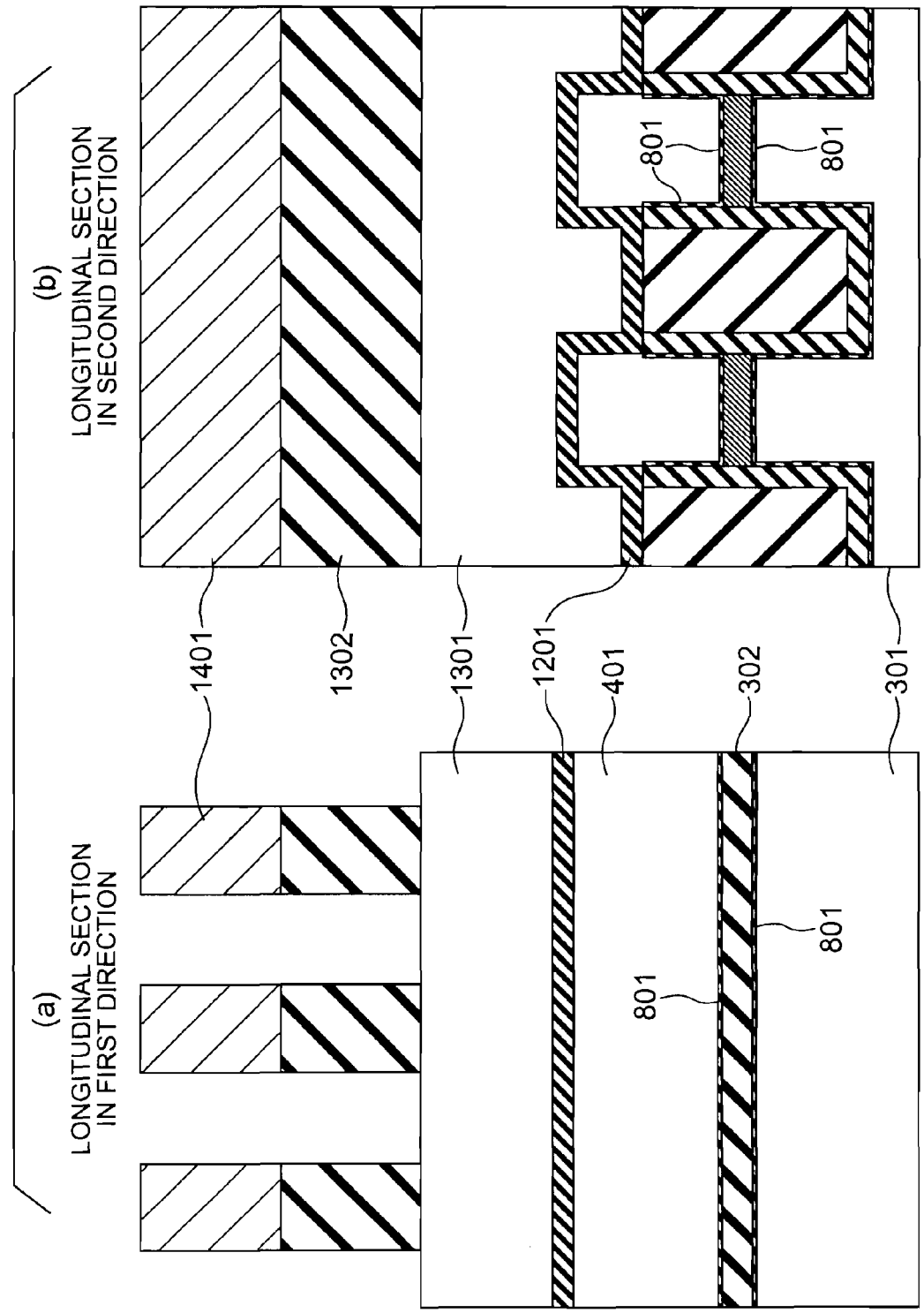
FIG. 14 is a sectional view showing a step subsequent to FIG. 13.
Figure 15:
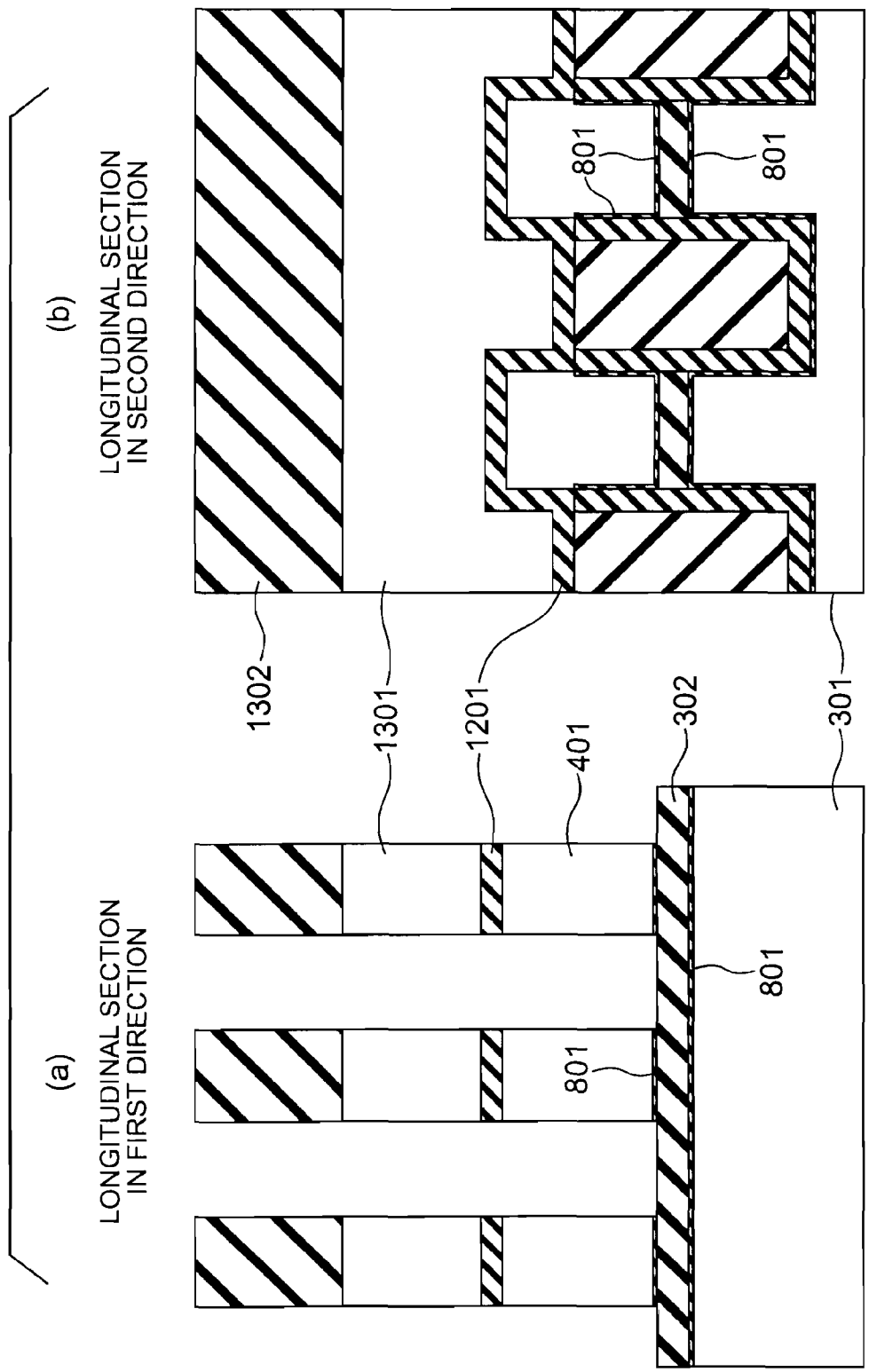
FIG. 15 is a sectional view showing a step subsequent to FIG. 14.
Figure 16:
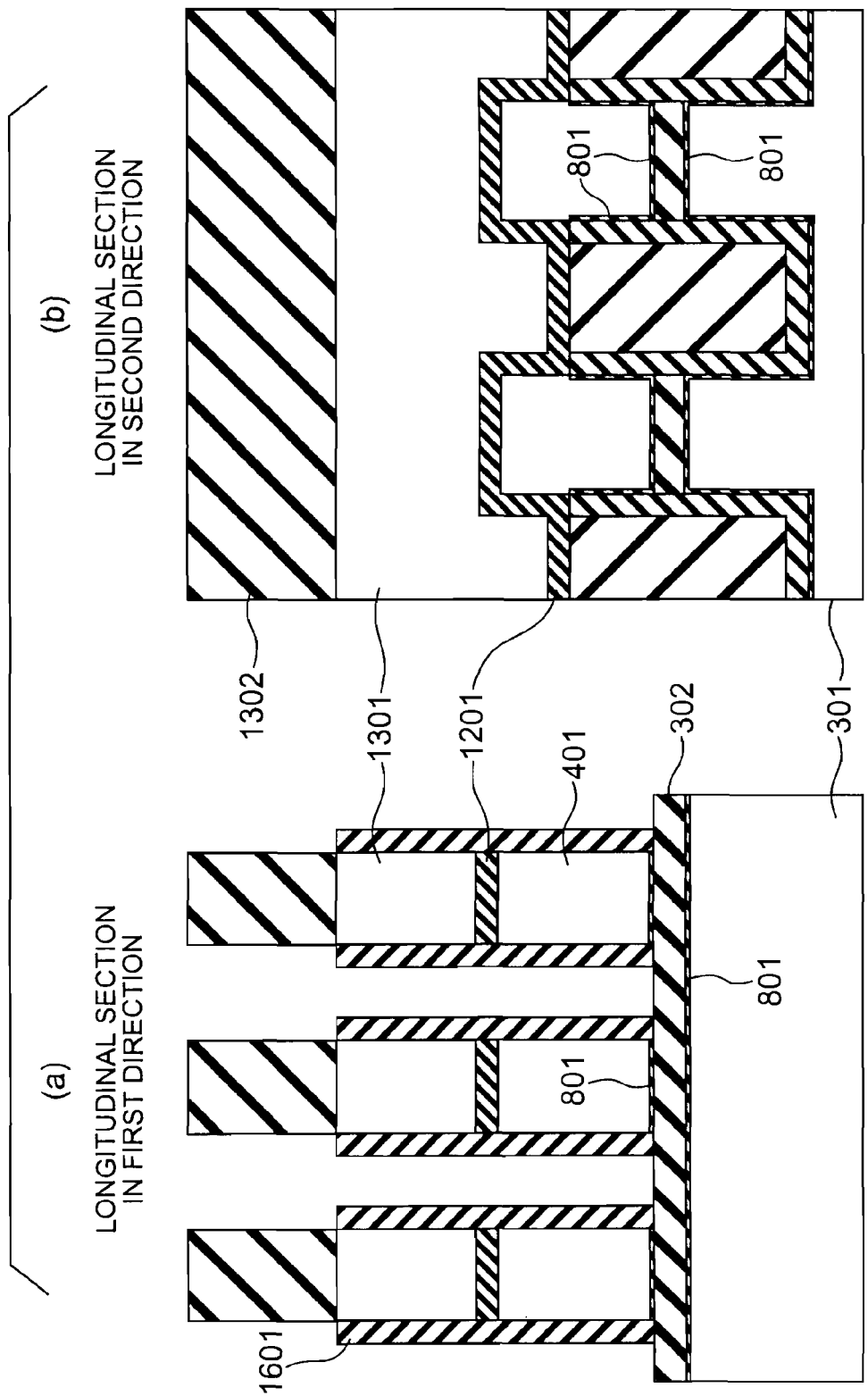
FIG. 16 is a sectional view showing a step subsequent to FIG. 15.
Figure 17:
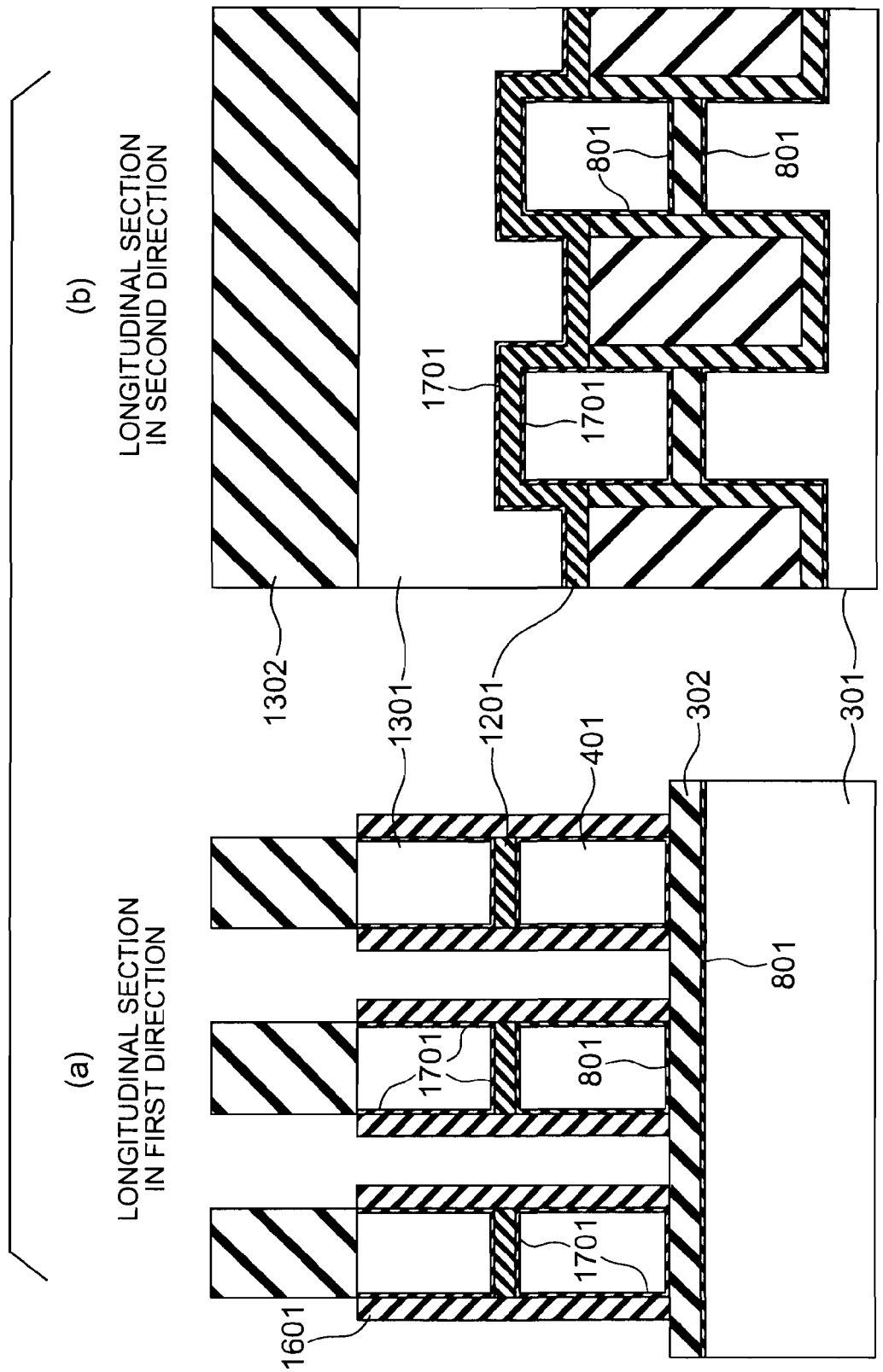
FIG. 17 is a sectional view showing a step subsequent to FIG. 16.

As shown in FIG. 10, a silicon oxide film (a buried insulating film) 1001 is deposited by the plasma CVD method and flattened to a top surface of the silicon nitride film 402 by the CMP method.

As shown in FIGS. 11(a) and 11(b), the height of the buried insulating film 1001 is reduced by etching and the silicon nitride film 402 is exfoliated by wet etching treatment so that a top surface of the polycrystalline silicon film 401 is exposed, whereby an element isolating structure is formed.

As shown in FIGS. 12(a) and 12(b), an ONO film 1201 is formed so as to cover the polycrystalline silicon film 401 and the buried insulating film 1001. The film thickness system adopted was $SiO_2/SiN/SiO_2$=6 nm/6 nm/6 nm.

As shown in FIGS. 13(a) and 13(b), a polycrystalline silicon film 1301 having a film thickness of 200 nm and a silicon nitride film 1302 having a film thickness of 150 nm are formed on the ONO film 1201 by the LPCVD method.

As shown in FIGS. 14(a) and 14(b), a photoresist 1401 is applied to the silicon nitride film 1302 and patterned in strip shape by using the lithography method with prescribed gaps along the second direction, and the silicon nitride film 1302 is processed by RIE, with the photoresist 1401 serving as a mask.

As shown in FIGS. 15(a) and 15(b), the photoresist 1401 is removed and the polycrystalline silicon film 1301, the ONO film 1201 and the polycrystalline silicon film 401 are sequentially processed by RIE in the vertical direction, with the silicon nitride film 1302 serving as a mask.

As shown in FIGS. 16(a) and 16(b), a silicon oxide film 1601 is formed on the side walls of the polycrystalline silicon film 1301, ONO film 1201 and polycrystalline silicon film 401 by using the thermal oxidation method or the radical oxidation method. This step is called the post-oxidation step and a recovery from damage introduced into the ONO film 1201 by RIE etching is made.

Although during the formation of the silicon oxide film 1601 an oxidizer enters the silicon oxynitride film 302, the oxidation of the surface of the polycrystalline silicon film 601 is suppressed by the layer 801 including an Si—N bond and the formation of a bird's beak is suppressed.

This enables the local concentration of a tunnel current to be lessened and variations in the capacitance of the tunnel insulating film (silicon oxynitride film 302) decrease.

As shown in FIGS. 17(a) and 17(b), oxynitriding treatment is performed with a nitric oxide (NO) gas or a nitrous oxide ($N_2O$) gas. Nitrogen passes through the silicon oxide film 1601 and precipitates on the surface of the polycrystalline silicon film 1301 and at the interfaces between the ONO film

1201 and the polycrystalline silicon films 1301, 401, whereby a layer having an Si—N bond (a nitrogen-precipitated layer) 1701 is formed.

The nitrogen concentration of the layer having an Si—N bond (the nitrogen-precipitated layer) 1701 is preferably not less than $2\times10^{15}$ atoms/cm$^2$ and more preferably not less than $5\times10^{15}$ atoms/cm$^2$.

Figure 18:
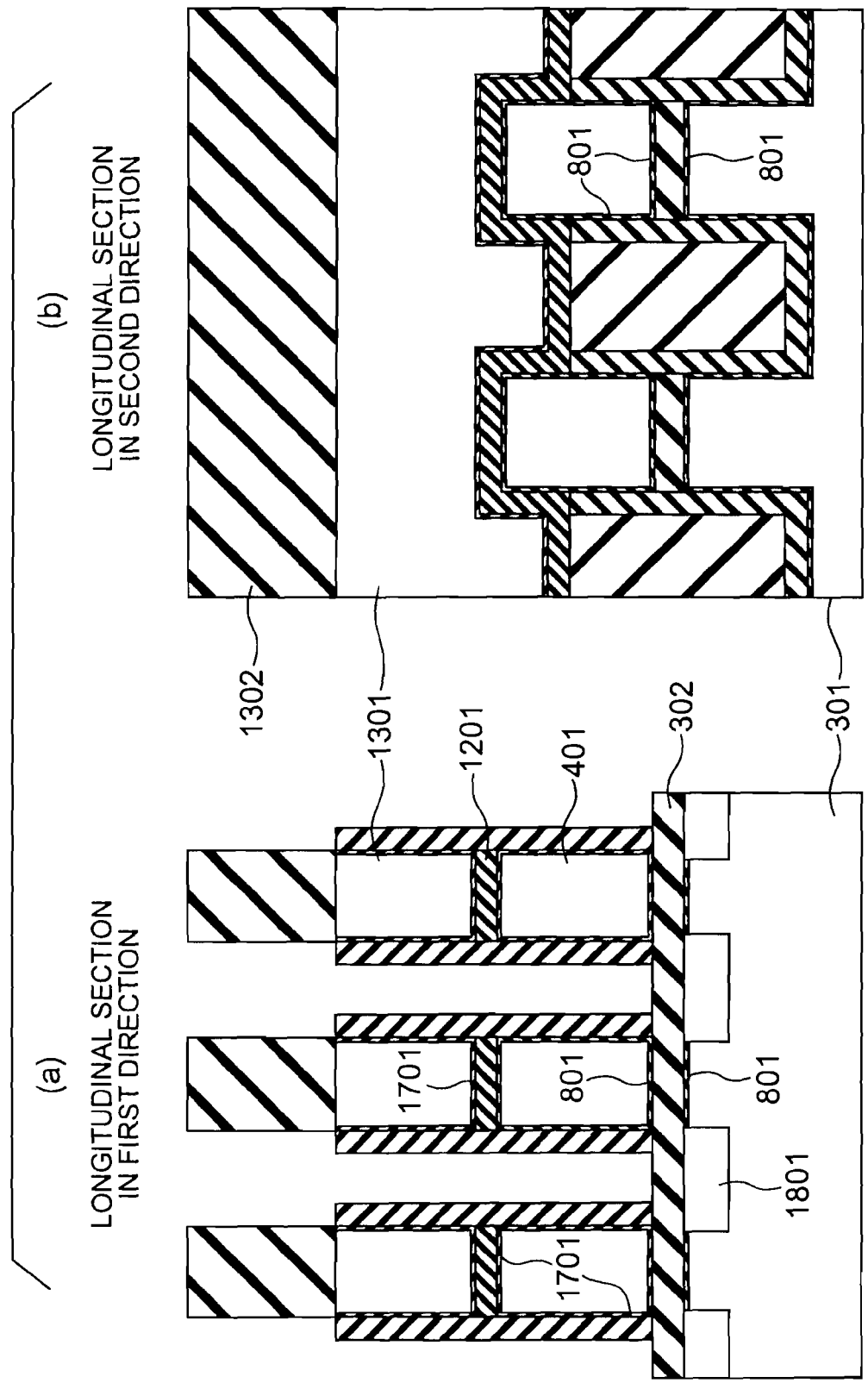
FIG. 18 is a sectional view showing a step subsequent to FIG. 17.

As shown in FIGS. 18(*a*) and 18(*b*), phosphorus ions, for example, are implanted into the silicon substrate 301 by ion implantation and activated by thermal annealing and a source-drain region 1801 is formed, whereby a transistor structure is formed.

After that, an interlayer dielectric film (not shown) is formed and a plurality of oxidation steps are performed, the steps including, for example, the densification treatment that raises the density of the interlayer dielectric film by oxidation treatment in a water atmosphere.

In the oxidation step, the layers including an Si—N bond (nitrogen-precipitated layers) 801, 1701 prevent an oxidizer from reaching the polycrystalline silicon films 401, 1301, and therefore it is possible to suppress the occurrence of the diminishing of the gates and variations in gate size.

It is possible to obtain a high-reliability nonvolatile semiconductor memory in which the formation of a bird's beak is suppressed in this manner and variations in the oxidation amount of the side walls of the gate electrode are reduced.

Figure 7:
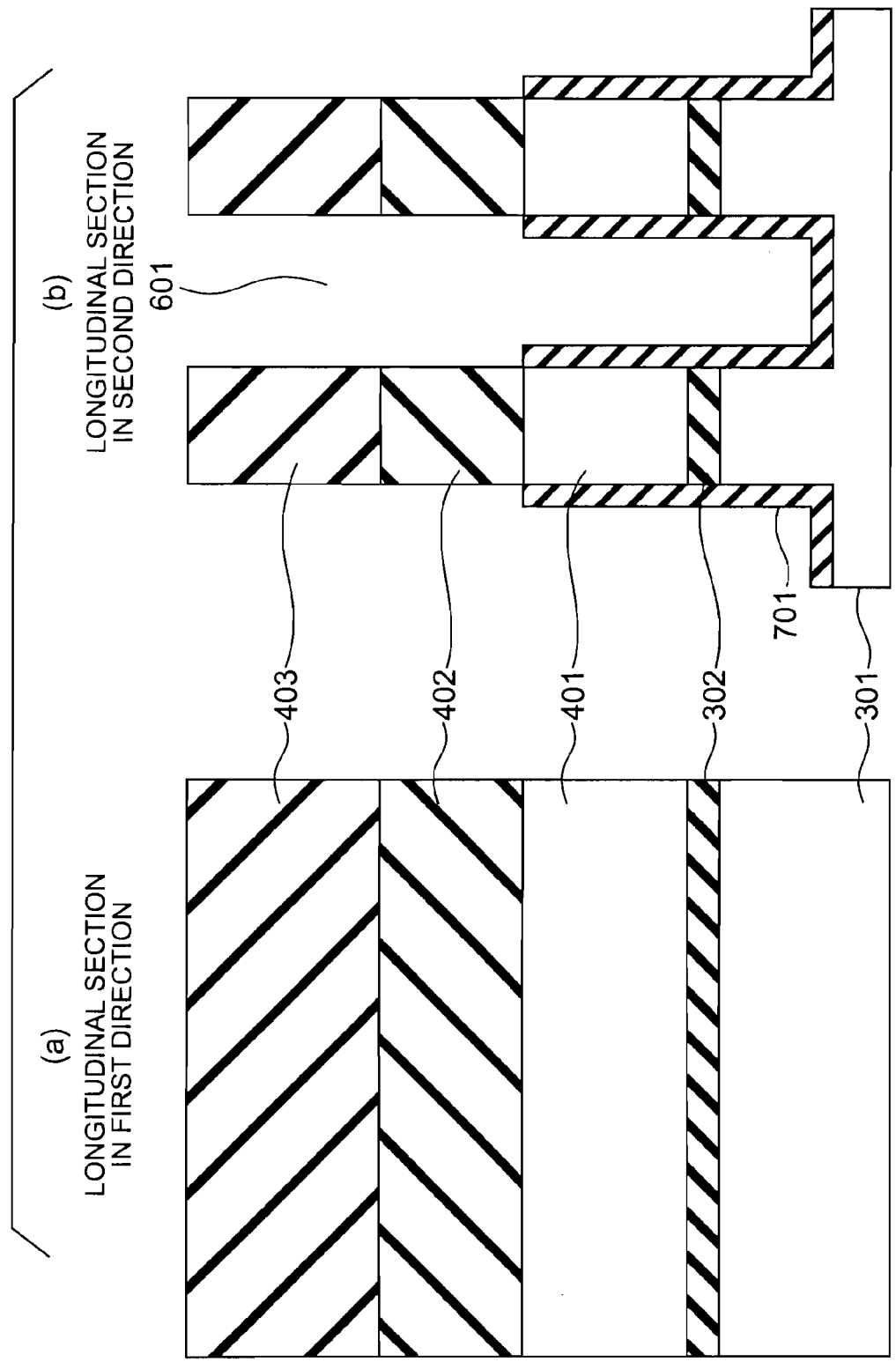
FIG. 7 is a sectional view showing a step subsequent to FIG. 6.
Figure 8:
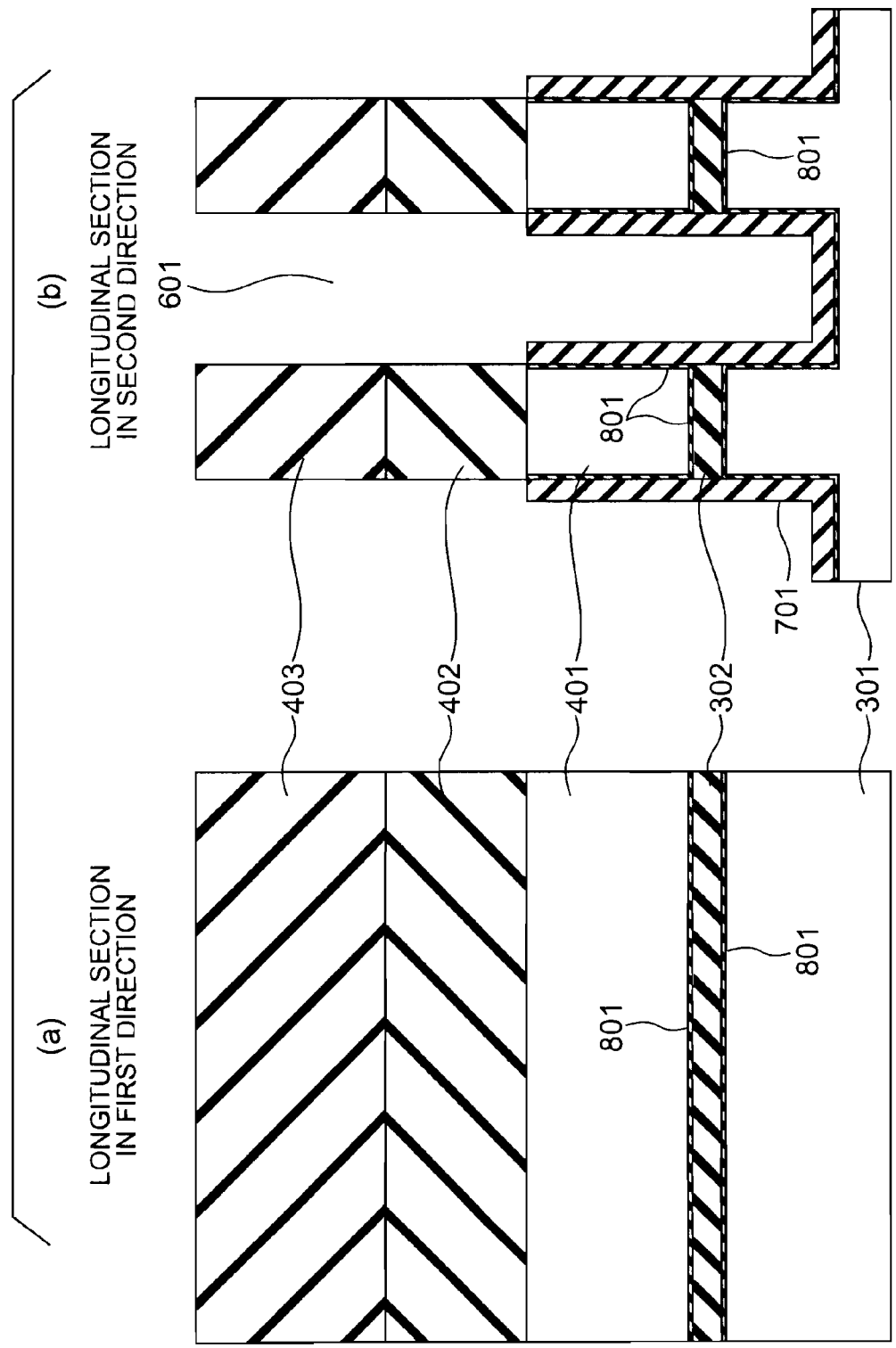
FIG. 8 is a sectional view showing a step subsequent to FIG. 7.

On the occasion of the oxidation of the inner wall within the trench 601 shown in FIG. 7(*b*), it is also possible to adopt a method that involves forming the layer including an Si—N bond (the nitrogen-precipitated layer) 801 by directly performing oxynitriding treatment with an NO gas or an N$_2$O gas.

What is claimed is:

1. A nonvolatile semiconductor memory, comprising:
    a semiconductor substrate;
    a first insulating film formed on a channel region on a surface portion of the semiconductor substrate;
    a charge accumulating layer formed on the first insulating film;
    a second insulating film formed on the charge accumulating layer;
    a control gate electrode formed on the second insulating film, and
    a third insulating film formed on side surfaces of the charge accumulating layer and between a bottom surface of the charge accumulating layer and the first insulating film,
    wherein a nitrogen concentration in the third insulating film is higher than a nitrogen concentration in the first insulating film.

2. The nonvolatile semiconductor memory according to claim 1, wherein the nitrogen concentration in the third film is not less than $2\times10^{15}$ atoms/cm$^2$.

3. The nonvolatile semiconductor memory according to claim 1, wherein the nitrogen concentration in the third film is not less than $5\times10^{15}$ atoms/cm$^2$.

4. The nonvolatile semiconductor memory according to claim 1, wherein nitrogen is on a top surface of the charge accumulating layer.

5. The nonvolatile semiconductor memory according to claim 1, wherein nitrogen is on a bottom surface and side surfaces of the control gate electrode.

6. The nonvolatile semiconductor memory according to claim 5, wherein the concentration of the nitrogen on the bottom surface and the side surfaces of the control gate electrode is not less than $2\times10^{15}$ atoms/cm$^2$.

7. The nonvolatile semiconductor memory according to claim 1, wherein the concentration of the nitrogen on the bottom surface and the side surfaces of the control gate electrode is not less than $5\times10^{15}$ atoms/cm$^2$.

8. The nonvolatile semiconductor memory according to claim 1, wherein the charge accumulating layer is a polycrystalline silicon film.

9. The nonvolatile semiconductor memory according to claim 1, wherein the control gate electrode is a polycrystalline silicon film.

10. The nonvolatile semiconductor memory according to claim 1, wherein nitrogen is on a top surface of the second insulating film.

11. The nonvolatile semiconductor memory according to claim 1, further comprising buried insulating films in the semiconductor substrate,
    wherein the first insulating film and the charge accumulating layer are formed between the buried insulating films,
    the second insulating film is formed on a top surface of the charge accumulating layer and top surfaces of the buried insulating films, and
    nitrogen is on a bottom surface of the first insulating film, and on side surfaces and bottom surfaces of the buried insulating films.

12. The nonvolatile semiconductor memory according to claim 1, further comprising buried insulating films in the semiconductor substrate,
    wherein the first insulating film is formed between the buried insulating films, and
    the second insulating film is formed on a top surface of the charge accumulating layer, on the third insulating film formed on the side surfaces of the charge accumulating layer, and on top surfaces of the buried insulating films.

* * * * *